United States Patent
Feiertag et al.

(10) Patent No.: US 8,571,239 B2
(45) Date of Patent: Oct. 29, 2013

(54) MEMS MICROPHONE

(75) Inventors: Gregor Feiertag, Munich (DE); Anton Leidl, Hohenbrunn (DE); Wolfgang Pahl, Munich (DE); Matthias Winter, Munich (DE); Christian Siegel, Munich (DE)

(73) Assignee: Epcos AG, Munich (DE)

( * ) Notice: Subject to any disclaimer, the term of this patent is extended or adjusted under 35 U.S.C. 154(b) by 90 days.

(21) Appl. No.: 13/282,668

(22) Filed: Oct. 27, 2011

(65) Prior Publication Data
US 2012/0093346 A1 Apr. 19, 2012

Related U.S. Application Data (63) Continuation of application No. PCT/EP2010/053718, filed on Mar. 22, 2010.

(30) Foreign Application Priority Data

Apr. 29, 2009 (DE) .......................... 10 2009 019 446

(51) Int. Cl.
*H04R 25/00* (2006.01)
*H04R 9/08* (2006.01)

(52) U.S. Cl.
USPC ........................................ 381/174; 381/369

(58) Field of Classification Search
USPC ........... 381/369, 174, 175; 257/704, 729, 730
See application file for complete search history.

(56) References Cited

U.S. PATENT DOCUMENTS

| | | | |
|---|---|---|---|
| 2006/0151203 A1* | 7/2006 | Krueger et al. ............... | 257/704 |
| 2006/0177083 A1 | 8/2006 | Sjursen et al. | |
| 2008/0157301 A1* | 7/2008 | Ramakrishna et al. ........ | 257/676 |
| 2008/0304681 A1* | 12/2008 | Langlois et al. .............. | 381/174 |
| 2009/0041270 A1 | 2/2009 | Schrank et al. | |
| 2010/0061572 A1 | 3/2010 | Hibbing | |
| 2010/0086164 A1* | 4/2010 | Gong et al. ................... | 381/369 |
| 2011/0186943 A1 | 8/2011 | Pahl et al. | |

FOREIGN PATENT DOCUMENTS

| | | |
|---|---|---|
| DE | 8631001 U1 | 3/1987 |
| DE | 10303263 A1 | 8/2004 |
| DE | 102004058879 A1 | 6/2006 |
| DE | 102005053765 A1 | 5/2007 |
| EP | 1764343 A2 | 3/2007 |
| WO | 2007/031270 A1 | 3/2007 |

OTHER PUBLICATIONS

International Search Report corresponding to International Patent Application No. PCT/EP2010/053718, European Patent Office, dated Jul. 28, 2010, 2 pages.

* cited by examiner

*Primary Examiner* — Brian Ensey
(74) *Attorney, Agent, or Firm* — Nixon Peabody LLP

(57) ABSTRACT

A microphone package wherein an MEMS microphone chip (MIC) is mounted on a substrate (SUB) and is sealed with a cover (ABD) with respect to the substrate. The membrane (MMB) of the microphone chip is connected to a sound entry opening (SEO) in the substrate via an acoustic channel. As a result of defined dimensioning of, in particular, the cross section and length of sound entry opening and channel, an acoustic low-pass filter is formed, the −3 dB attenuation point of which is significantly below the natural resonance of microphone membrane and package.

20 Claims, 5 Drawing Sheets

MEMS MICROPHONE

CROSS-REFERENCE TO RELATED APPLICATION

This application is a continuation of prior International Patent Application Serial No. PCT/EP2010/053718, filed Mar. 22, 2010, entitled "Mems Microphone," which claims the benefit of priority of Germany Patent Application Serial No. 10 2009 019 446.0, filed in Germany on Apr. 29, 2009, each of which is hereby incorporated by reference.

COPYRIGHT

A portion of the disclosure of this patent document contains material which is subject to copyright protection. The copyright owner has no objection to the facsimile reproduction by anyone of the patent disclosure, as it appears in the Patent and Trademark Office patent files or records, but otherwise reserves all copyright rights whatsoever.

BACKGROUND OF THE INVENTION

Miniaturized microphones are nowadays increasingly being produced as MEMS microphones (=microelectro-mechanical system) with the aid of micromechanical structuring technology from a crystalline material, in particular a semiconductor material. In this case, in general an electrically conductive membrane serves as an acoustoelectric sound transducer, said membrane forming a varying capacitance with respect to a counterelectrode under the action of sound.

BRIEF SUMMARY OF THE INVENTION

For mechanical protection, MEMS microphones are incorporated into a housing or a package having at least one sound opening through which the sound can pass into the interior of the housing. In this case, the sound can be guided via a sound channel, which is angular if appropriate, in order to avoid contamination of, or damage to, the microphone membrane. An angled sound channel can be achieved for example by lateral offsetting of sound opening and microphone membrane or MEMS microphone chip. It is also possible to tilt the microphone chip by 180° and to lead the sound channel around the microphone chip.

For the miniaturization of MEMS microphones it has already been proposed to position an MEMS microphone chip on a carrier substrate above a sound entry opening and to cover the entire system including the MEMS microphone chip with a film. In this case, it is possible to arrange the IC component required for the microphone function, usually an ASIC, alongside the microphone chip and preferably cover it with the same film. The film can be a laminatable plastic film, which is metallized if appropriate.

What is disadvantageous about miniaturized MEMS microphones is, in particular, their low mechanical stability, since the microphone membrane has a high susceptibility to fracture by virtue of the small material thickness. Moreover, during speech transmission at relatively high frequencies, a nonlinear frequency response with resonant magnifications is observed with these microphones, which is undesirable in acoustics and in particular in the case of microphones and impairs the transmission quality. As a result of the miniaturization, furthermore, the distance between sound entry opening and membrane is shortened, such that the membrane is more susceptible to contaminants which can deposit on the membrane, which in turn cause to an increased extent nonlinearities and resonant magnifications during transmission, impair the functionality of the membrane or even damage the membrane.

Therefore, it is an object of the present invention to specify an MEMS microphone which has an increased mechanical strength in conjunction with a frequency response that is improved with respect to the linearity.

The object is achieved according to the invention by means of a microphone package, comprising a substrate; an MEMS microphone chip having a membrane, said microphone chip being mounted on top of the substrate; a cover, which is seated on top of the substrate and encloses the microphone chip between itself and the substrate; at least one sound entry opening through the substrate or the cover; and a front volume in front of the membrane, said front volume being connected to the sound entry opening via a channel, wherein the at least one sound entry opening, the channel and the front volume form a cavity system and have a geometry defined such that an air friction arises and the cavity system forms an acoustic low-pass filter having a −3 dB attenuation point below the natural resonances of the membrane and the package, and wherein the −3 db attenuation point of the acoustic low-pass filter is at a frequency of 75% or less of the natural resonance of the membrane. Advantageous configurations of the invention can be gathered from further aspects disclosed herein.

The microphone package has an MEMS microphone chip, which is arranged on a substrate and covered with a cover which, in a manner bearing against the microphone chip, effects tight sealing with respect to the substrate. A front volume is formed in front of the membrane, that is to say principally in the region between membrane and substrate, while a back volume can be arranged behind the membrane.

A sound entry opening leads either through the substrate or the cover into the volume enclosed by the cover and the substrate. Said front volume, the sound entry opening and an acoustic channel connecting the two, form a cavity system.

According to the invention, this cavity system is now dimensioned or has a geometry such that, under the action of sound, an air friction can arise and the cavity system thereby forms an acoustic low-pass filter. The latter is configured such that its −3 dB attenuation point turns out to be below the natural resonances of membrane and package.

The invention is based on the insight that both the membrane and the entire microphone package in each case have a natural resonance, in the vicinity of which particularly great deviations from the linear frequency response occur during sound transmission. By means of the invention, the cavity system is now configured such that higher frequencies in the vicinity of the natural resonance are attenuated to a particularly great extent, while lower frequencies can pass to the membrane without being impeded. This prevents excessively high frequencies from being able to excite the system comprising microphone chip and microphone package to natural resonance, which would produce a particularly great excitation and thus resonant magnifications of the frequency response that deviate greatly from the linear frequency response.

Furthermore, the invention increases the mechanical stability of the microphone membrane and thus the durability of the entire microphone, since the excitation of natural resonances is effectively prevented. Particularly in the so-called drop test, which simulates an impact, e.g. after the microphone or a device comprising the microphone package has been dropped, in the case of known microphone constructions the membrane is excited to natural resonance, in the case of which it experiences a particularly high deflection and a particularly great mechanical stress, which can consequently lead to the fracture of the membrane and thus to the failure of the microphone. The microphone package according to the invention reduces the excitation of the membrane at the resonant frequency in the drop test as well. Therefore, the microphone package is protected against damage to the microphone membrane better than conventional microphones when dropped or in the case of a correspondingly great mechanical action.

It is sufficient if the −3 dB attenuation point of the low-pass filter is below the natural resonances of membrane or package. It is particularly advantageous, however, if the −3 dB attenuation point is at a frequency of approximately 75% or less of the natural resonance of the membrane.

In one embodiment, the total opening cross section of the sound entry openings is distributed among 2-20 sound entry openings in the substrate, which together have a total cross-sectional area of less than 50% of the membrane area. A total cross-sectional area of the sound entry openings which is reduced in such a way surprisingly has the effect of reducing the sensitivity toward high frequencies in the region of the natural resonance of membrane or package. In this way, it is possible to attenuate the natural resonances of membrane and package with more than 30 dB. At the same time, the division along a plurality of openings with the total cross-sectional area of the sound entry openings remaining the same provides for an improved low-pass filter effect.

In accordance with one embodiment, the aspect ratio of the sound entry openings, that is to say the ratio of the length of the sound entry opening to the diameter, is between 0.5 and 3. It has been found that a small cross section of the sound entry openings is often insufficient for the desired low-pass filter effect and is effective in this regard only when it is combined with a suitable aspect ratio.

It is advantageous to provide a sound entry opening having a relatively small cross section. It is advantageous, for example, if the cross section of the sound entry openings is between 50 and 200 µm, and in particular approximately 100 µm.

In accordance with the advantageous aspect ratio, the length of the sound entry openings is then between 50 and 500 µm, in particular approximately 150 µm.

In one concretized embodiment, the microphone package has four sound entry openings each having a diameter of approximately 90-100 µm with an aspect ratio of 1.3 to 1.7.

Advantageously, the microphone chip with the microphone membrane faces downward toward the substrate, where, in one embodiment, the at least one sound entry opening is also situated. The distance between microphone membrane and substrate is advantageously between 5 and 100 µm. It can be defined, for example, by means of the diameter or the height of the bumps with which the microphone chip is fixed on the substrate. The diameter of the microphone membrane itself is minimized and is approximately 1000 µm, for example. The front volume is substantially determined from the area of the microphone chip times the distance between microphone chip/substrate if the cover bears the microphone chip and the substrate tightly against the side areas of the microphone chip and seals the free space between microphone chip and substrate from the outside as tightly as possible. Furthermore, other volumes can also contribute to the front volume provided that they are connected to one another via the cavity system. By way of example, an IC component can be arranged alongside the microphone chip, below which a free volume can likewise be situated, which contributes to the front volume, in the same way as a free volume which can be situated between microphone chip and IC component.

Usually, however, on account of the size relationships, the front volume is substantially determined by the enclosed hollow space between microphone and substrate. Other volumes between substrate and cover can be negligible in terms of the effect on the acoustic properties.

In accordance with one embodiment, the substrate of the microphone package is embodied in a multilayered fashion and has at least two dielectric layers and an integrated wiring contained therein. The substrate advantageously comprises a material selected from HTCC (High-Temperature Cofired Ceramic), LTCC (Low-Temperature Cofired Ceramic) and FR-4 epoxy material, in particular a fiber-reinforced resin laminate, for example glass-fiber-reinforced laminate based on epoxy resin.

The integrated interconnection serves for leading electrical connections of the microphone chip through the substrate to external contacts on the underside of the substrate. Furthermore, an electrical connection between microphone chip and an IC (integrated circuit) component concomitantly contained, if appropriate, in the microphone package is produced via the integrated interconnection. Optionally, passive components that are part of the electrical interconnection of microphone chip and IC component can additionally be integrated in the substrate.

In a further embodiment of the invention, a metallization is applied at a location on or between the dielectric layers of the multilayered substrate, said metallization being exposed in the sound entry openings. In accordance with a further embodiment, the metallization is arranged on the underside of the substrate in the region of the sound entry opening. Preferably, said metallization is connected to ground potential and serves to conduct away harmful overvoltages, which can occur in the form of ESD (electrostatic discharge) pulses, for example, harmlessly to ground. Damage to the sensitive membrane and in general the entire microphone and the IC component contained therein is avoided in this way. This metallization also makes it possible to reduce or prevent RF (radio frequency) interference radiated into the interior of the microphone package.

In one configuration, the metallization is embodied in the region of the sound opening in a planar fashion on a surface facing downward, that is to say away from the microphone chip, such that the sound entry openings lie within the metallization and therefore perforate the metallization.

In accordance with a further embodiment, the sound entry opening has two sections, wherein a first section is formed in a lower, e.g. the bottommost, dielectric layer of the substrate and the second section is formed in an upper, e.g. the topmost, dielectric layer of the substrate. The diameter of the first section is greater than that of the second section.

Advantageously, a plurality of second sections lie in the region of the first section, such that a large common opening in the lower substrate layer encompasses a multiplicity of smaller openings in the upper substrate layer. These can be the 2 to 20 sound entry openings mentioned. Accordingly, the total sound entry opening tapers from the first section to the second section in a step. The metallization can then be applied on the entire surface of said step that faces downward freely, and in this case said metallization encloses the total quantity of the sound entry openings of the second section.

The IC component is preferably applied alongside the microphone chip on the substrate and advantageously covered with the same cover. However, the IC component can also be arranged at a different location in, on or below the package.

IC component and microphone chip can each be mounted alongside one another in the substrate using flip-chip technology. This has the advantage that the electrical contact-connection to the substrate, the interconnection of the two chips or components and the mechanical fixing can be effected in one step. Furthermore, it is advantageous that the rear sides of IC component and microphone chip are free of electrical connections in this way, such that the cover can be laminated on in the form of a film in a simple manner. A flip-chip-mounted IC component creates an additional free volume which, for a given spatial connection, can be considered to be associated with the cavity system and thus with the front volume.

The membrane of the microphone chip preferably faces toward the substrate. The cutout in the microphone chip behind the membrane (viewed in the sound direction), which cutout can be a hollow space or, in particular, perforates the entire chip apart from the membrane, forms the back volume for the microphone. In order to protect the latter during the encapsulation by means of a covering film, said cutout, in one embodiment, on the rear side of the microphone chip, is covered with a film that covers said cutout as a covering layer. This covering layer has a sufficient degree of stiffness in order that, upon the lamination of the further cover over the entire microphone chip and the integrated IC component, it withstands the forces which occur in this case and act on the microphone chip, and, in particular, the back volume is left unimpaired.

In a further embodiment, microphone chip and IC component are arranged one above another. In this case, the IC component, which is smaller in terms of its dimensions, can be arranged below the microphone chip, that is to say between microphone chip and substrate. In one embodiment, a cutout in the surface of the substrate is provided for the IC component in order still to ensure a defined front volume in the case of this arrangement.

The invention is explained in greater detail below on the basis of exemplary embodiments and with reference to the associated nine figures. The figures have been drawn up schematically and not to scale. Individual parts may be illustrated in an enlarged manner for the sake of better clarity, and so relative dimensional specifications cannot be gathered from the figures either.

DETAILED DESCRIPTION OF THE INVENTION

Figure 1:
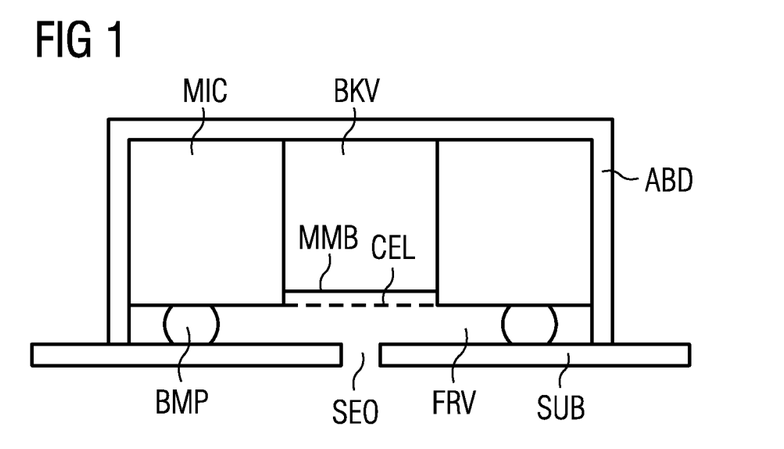
FIG. 1 shows a microphone package embodied in a simple manner in schematic cross section.

FIG. 1 shows the simplest possible construction of a microphone package according to the invention on the basis of a schematic cross section. The microphone chip MIC is embodied as an MEMS component composed of a crystalline material, in particular composed of crystalline silicon. With the aid of its downwardly facing contacts, it is mounted on a substrate SUB by means of bumps BMP and is also electrically contact-connected via the bumps.

The microchip MIC operates, for example, according to the capacitive principle and, for this purpose, has a membrane MMB at a small distance from a rigid counterelectrode CEL, which are both arranged at the downwardly facing surface of the microphone chip. Above/behind the membrane there is a cutout BKV, which is produced for the purpose of exposing the membrane, for example by means of etching from the top side. Arranged below/in front of the membrane, but with a reduced cross section with respect to the membrane area, there is a sound entry opening SEO extending through the substrate SUB. In a variant that is not illustrated, the sound entry opening SEO is provided laterally with respect to the microphone chip in the cover in such a way that it opens up a connection to the front volume.

A cover ABD is arranged above substrate SUB and microphone chip MIC such that it preferably tightly encloses the microphone chip MIC and in this case closes off and seals the free space between microphone chip and substrate from the outside in a flush manner. Between microphone chip or between membrane MMB and substrate SUB, the front volume is embodied as a hollow space that is at least largely closed off. The cutout in the microphone chip which is enclosed below the cover forms the back volume BKV of the microphone.

The effects of the dimensioning of front volume and sound entry opening and of the cavity system overall have, as will also be shown later, effects on the acoustic behavior and, in particular, on the low-pass filter function of the microphone package which is realized according to the invention.

Figure 2:
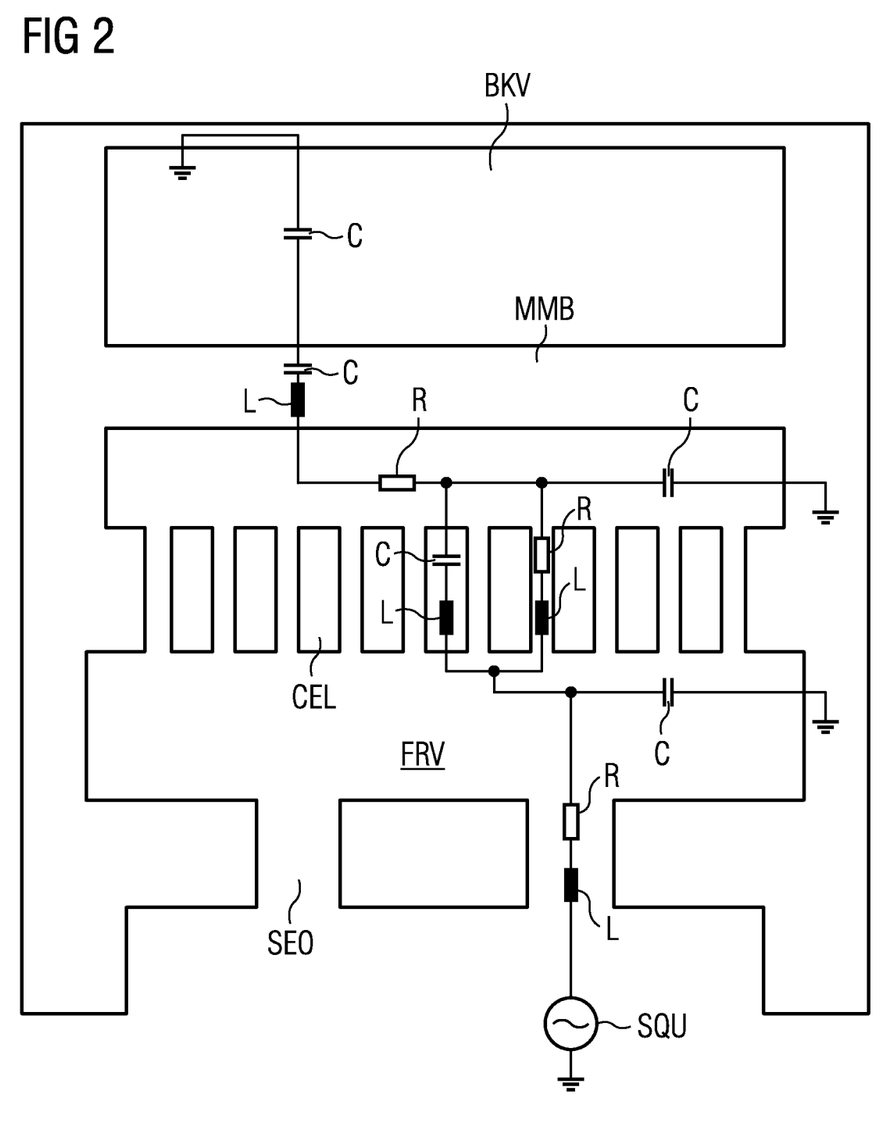
FIG. 2 shows an electrical equivalent circuit diagram assigned to the components of the microphone package.

FIG. 2 shows, in a detailed model established by the inventors and including the most important components that determine the acoustic behavior of the microphone package and the matching, correspondingly equivalent, electrical components which can be assigned to the acoustic low-pass filter or the electrical equivalent thereof.

Such acoustic and electrical components can be divided into resistances, inductances and capacitances. A resistance arises, for example, in narrow openings such as are formed, in particular, by the sound entry openings SEO. The counterelectrode CEL, which is usually perforated and accordingly also has narrow passages, also offers the sound or the enclosed vibrating air masses a resistance, which can be equated with an electrical resistance. The air situated in the sound channel has a frictional resistance R when said air is displaced. Fast pressure changes are no longer compensated for by air flow; instead, the air is compressed and thus functions as a spring which damps the deflection of the microphone membrane. The general resistance R which a narrow opening offers to a medium can be estimated in accordance with the following formula:

$$R = \frac{8*\eta*1}{\eta*r^4}$$

where η is the viscosity of the medium, here air, 1 is the length and r is the radius of the opening. It is evident that the resistance is inversely proportional to the fourth power of the radius r of an opening. As the opening becomes smaller, the resistance with which the opening opposes a sound wave rises sharply. In the model in accordance with FIG. 2, which is illustrated in a distorted fashion, the greatest resistance R arises in the narrow volume between membrane MMB and counterelectrode CEL, which, for a given microphone chip, goes back e.g. to a distance between membrane and counterelectrode that has a dimensioning of only approximately 2 μm.

Inductive acoustic components L arise where the medium (the air) has to be accelerated. In the model shown, this likewise takes place in the perforations and narrow channels, in particular in the sound entry openings SEO and the perforations of the counterelectrode CEL. Furthermore, it is possible, of course, to configure the acoustic channel, that is to say the distance that has to be covered by the sound from the sound entry opening as far as the membrane, in a corresponding manner and to convert the acoustic elements there into electrical equivalent circuit diagrams. The inductance L of such an opening can be estimated in accordance with the following formula:

$$L = \frac{\rho*(1+0.8*2*r)}{r^2*\eta}$$

In this equation, ρ represents the density of the medium (air), r represents the radius of the opening or of the tube, and 1 represents the length thereof. It is evident that the inductance L is inversely proportional to the square of the radius r of the opening. As the radius becomes smaller, therefore, both resistance and inductance increase, wherein the increase in the resistance with a dependence on $r^4$ rises significantly faster than the inductances with a dependence of $r^2$. The greatest contribution is supplied via the inductance determined by the sound entry openings.

In this model, capacitive elements are effective at the locations where the air flow has to work against a large volume, as constituted by the front volume FRV. In the refined model represented, the front volume is split into the volume between membrane MMB and counterelectrode CEL and into the volume between counterelectrode CEL and substrate SUB. Both volumes act as capacitances in the equivalent circuit diagram. Owing to the small size of the first-mentioned volume relative to the last-mentioned volume, however, it can be disregarded in the consideration and also in the calculation.

Figure 7:
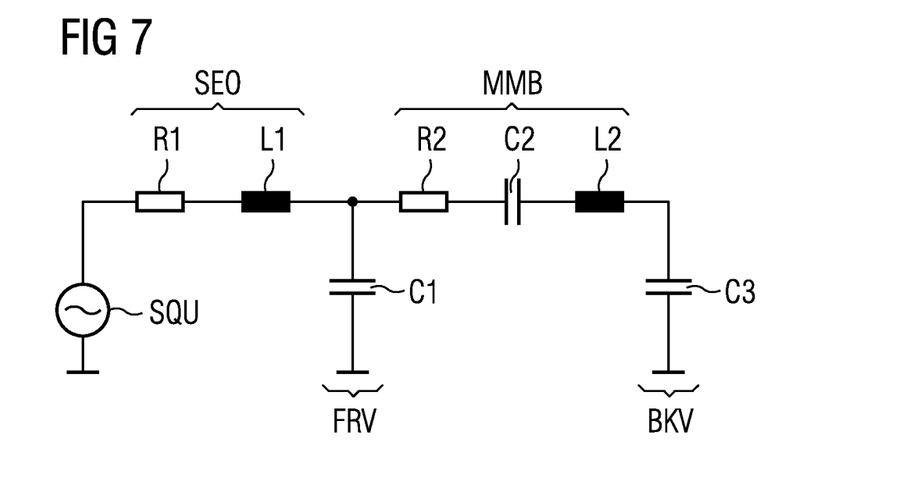
FIG. 7 shows a simplified acoustic equivalent circuit diagram for the MEMS microphone package.

FIG. 7 shows an equivalent circuit diagram for the microphone package that is simplified. This comprises, in a serial branch, a first resistance R1 and a first inductance L1, which are formed by the sound entry openings SEO and are dependent on the dimensioning thereof.

A first capacitance C1 is arranged in a first transverse branch with respect to ground, said first capacitance corresponding to the volume between counterelectrode CEL and substrate SUB. Furthermore, there are arranged in the serial branch a second resistance R2, a second capacitance C2 and a second inductance L2, which are determined by the membrane MMB and the counterelectrode CEL and are predetermined as it were by a given microphone chip. C2 and L2 are defined by the mechanical properties of the membrane and counterelectrode. The resistance R2 substantially corresponds to the resistance which was mentioned in conjunction with FIG. 2 and which is produced by the small volume or the narrow distance between membrane and counterelectrode, and also the resistance produced by the openings in the counterelectrode CEL. A second transverse branch is connected in parallel with said series circuit with respect to ground, a third capacitance C3 being arranged in said second transverse branch. Said third capacitance corresponds to the back volume BKV.

It is clearly evident from this model that the acoustic components together perform a low-pass filter function in which high frequency components have a high attenuation, while the components of lower frequencies experience only low attenuation. The properties of the low-pass filter can be set independently of a possibly invariable since defined microphone chip solely by means of the dimensioning of the cavity system in the microphone package.

The low-pass filter realized in this way has, by means of correspondingly dimensioned and rated components, a cut-off frequency which—explained in a simplifying manner—can be reduced with a greater length and smaller diameters of the sound entry opening(s) and/or of the acoustic channel, or else by means of a smaller number of otherwise unchanged sound entry openings. Corresponding dimensioning of the geometrical equivalents of the electrical equivalent circuit diagram makes it possible to set the attenuation properties of the low-pass filter to a desired value such that a −3 dB attenuation point lies in a range located sufficiently below the natural resonance of the membrane and also below the natural resonance of the entire package. Said −3 dB attenuation point advantageously even lies below a frequency corresponding to 75% of the natural frequency mentioned.

Figure 8:
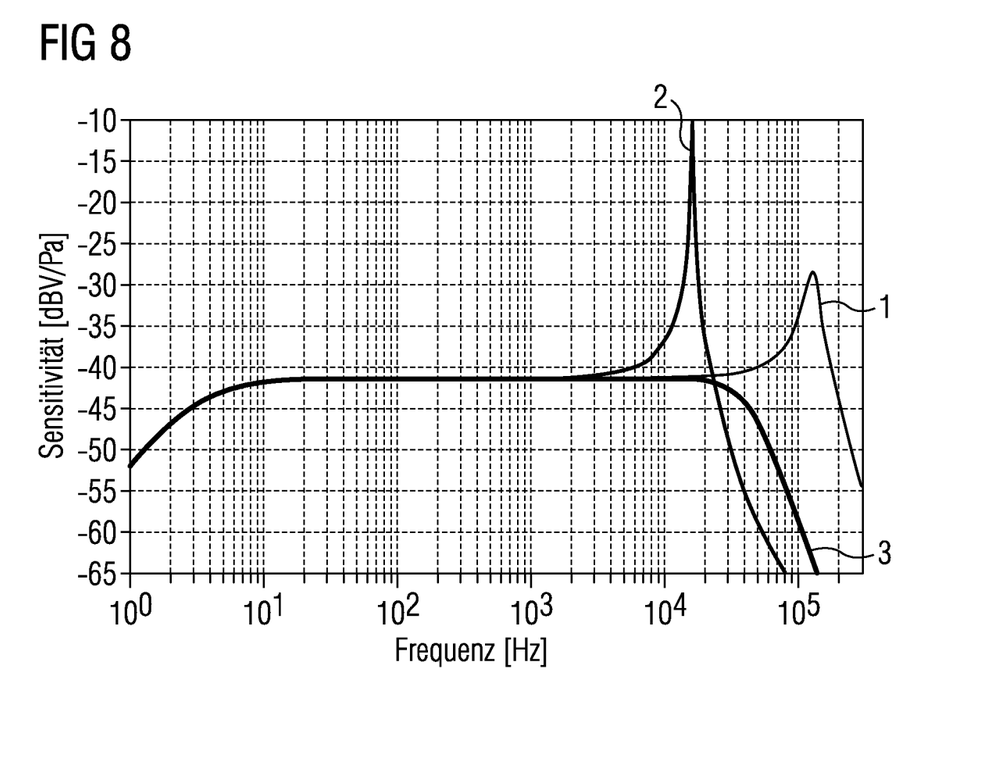
FIG. 8 shows in various curves, the acoustic behavior of a microphone chip without a package, with a known package and with a package according to the invention.

FIG. 8 shows, on the basis of various curves, the acoustic behavior of an unpackaged microphone chip (curve 1), of a microphone chip with conventional packaging without a low-pass filter effect (curve 2), and the behavior of a microphone in a microphone package embodied according to the invention (curve 3). As shown by curve 1, an unpackaged microphone has a narrow range with increased sensitivity, corresponding to the natural resonance of the membrane. Nonlinear behavior of the microphone therefore occurs in this range. Furthermore, undesired excitation of the natural resonance of the membrane can be initiated by a fall or impact, which can usually excite a broad spectrum of frequencies. As a result of the increased sensitivity at natural resonance, the membrane can in this case be loaded to a particularly great extent and therefore tends toward damage.

The acoustic behavior of an MEMS microphone having a conventional package is illustrated by curve 2. In this case, too, the natural resonance of the membrane is still manifested, but only as a small secondary maximum. Here the natural resonance of the entire package occurs as a second primary maximum, but said resonance, as shown by the curve, leads to an even greater acoustic nonlinearity in the natural resonance, which impairs the properties of the microphone further.

A microphone package which is embodied according to the invention, and wherein, in particular, the sound entry openings and the front volume are dimensioned in a suitable manner, thus giving rise to a low-pass filter having a corresponding filter effect for the natural resonance of package and membrane, is illustrated by curve 3. It is evident that frequencies in the range of the abovementioned natural resonances are virtually completely attenuated and no longer have a maximum there. Rather, curve 3 shows a widened plateau, in the range of which a linear acoustic behavior of the microphone can be observed. This behavior is ideal for a microphone having high linearity as represented by the invention.

The attenuation of the natural resonance furthermore increases the robustness of the microphone package in relation to shock loads, which has an advantageous effect on the reliability of the device, e.g. in the so-called drop test. As a result of the attenuation of the amplitudes at the natural resonant frequencies, the maximum deflection of the microphone membrane is reduced and loading fracture is prevented.

A further advantage of a reduced-diameter sound entry opening or of some other opening in the course of the acoustic channel is improved mechanical shielding of the membrane or generally of the interior with respect to relatively large particles. It is found that the acoustic performance otherwise, and in particular the sensitivity below the natural resonance or below the cut-off frequency of the low-pass filter, is provided sufficiently well or not significantly impaired by the invention. In this way, it is possible to minimize the size of the microphone further, without in this case having to accept an excessively great deviation from a linear frequency response. Previously, excessively great nonlinearities had to be compensated for in particular by enlargement of the membrane and hence of the entire microphone. Therefore, with the same mechanical loading capacity, a microphone package according to the invention can be made significantly smaller than known microphone packages. For the design of the microphone package according to the invention, in the case of the preferred construction, no additional parts or work operations are required; the components of the package which are known per se are merely dimensioned or modified in a suitable manner.

Figure 3:
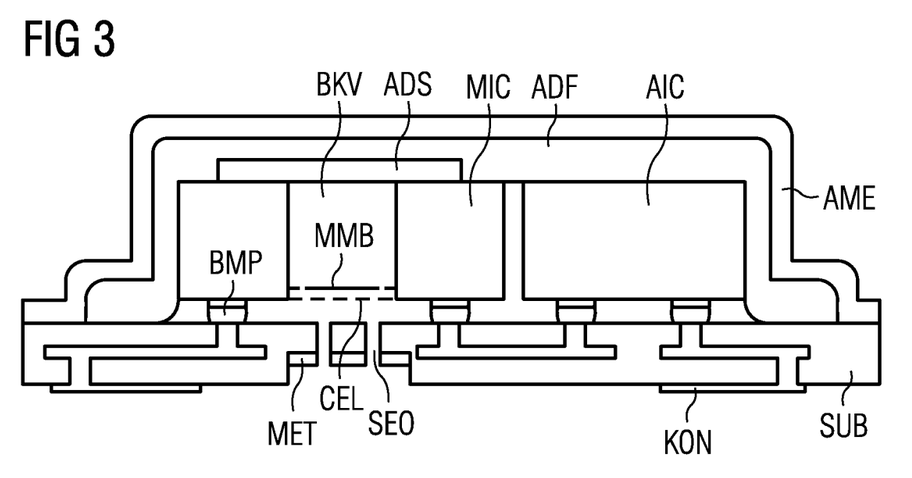
FIG. 3 shows an exemplary microphone package with an additional IC component.

FIG. 3 shows in schematic cross section a further microphone package having further possible configurations. In principle, the microphone package also comprises, alongside the microphone chip MIC, the IC component AIC, which performs various electronic tasks of the microphone and comprises, in particular, an amplifier. Microphone chip MIC and IC component AIC are both mounted in flip-chip design on a multilayer substrate SUB, which is illustrated here in a two-layered fashion, and are electrically contact-connected to the integrated structured metallization of said substrate, said metallization being arranged on and between the dielectric layers. External contacts KON for electrically contact-connecting the microphone package to an external circuit environment are situated at the underside of the substrate.

In contrast to the illustration, the counterelectrode CEL can also be arranged above the membrane, such that the volume between membrane MMB and counterelectrode CEL can be considered to be included in the back volume BKV.

The cover is also furthermore illustrated in detail. Said cover comprises, directly above the microphone chip MIC, a rigid covering layer ADS, which has sufficient stability for reliably protecting the back volume BKV of the microphone chip during the application of the cover. The covering layer ADS can also be a film. The covering layer ADS can be applied over the whole area over the two chips. However, it is preferably produced in an integrated manner during the production of the microphone chip MIC.

The cover furthermore comprises a covering film ADF, which can be laminated on in a softened or soft state and can then be cured. The covering film ADF can be a thermoplastic film or a thermosetting plastic film in the B state. Outside the region occupied by microphone chip MIC and IC component AIC, the covering film ADF seals tightly with the surface of the substrate SUB all around.

At a distance from the chips MIC and AIC and all around them, at least one region of the substrate surface is exposed. An external metallization AME is applied above or on the covering film ADF, for example by means of plating methods. The external metallization AME terminates flush with the substrate surface SUB. It firstly seals the package hermetically toward the top and secondly provides for electromagnetic shielding of the microphone.

Below the membrane MMB of the microphone chip MIC sound entry openings SEO are realized in the substrate SUB, two of said sound entry openings being illustrated in cross section in the figure. Furthermore, it is evident from the figure that a cutout is arranged in the lower of the two dielectric layers illustrated, the basic area of which cutout encompasses all the sound entry openings SEO. In the bottom of the cutout, that is to say on the downwardly facing surface of the upper dielectric layer, a metallization MET is applied, which, preferably, apart from the area of the sound entry openings SEO, can be arranged continuously below the membrane.

Figure 4:
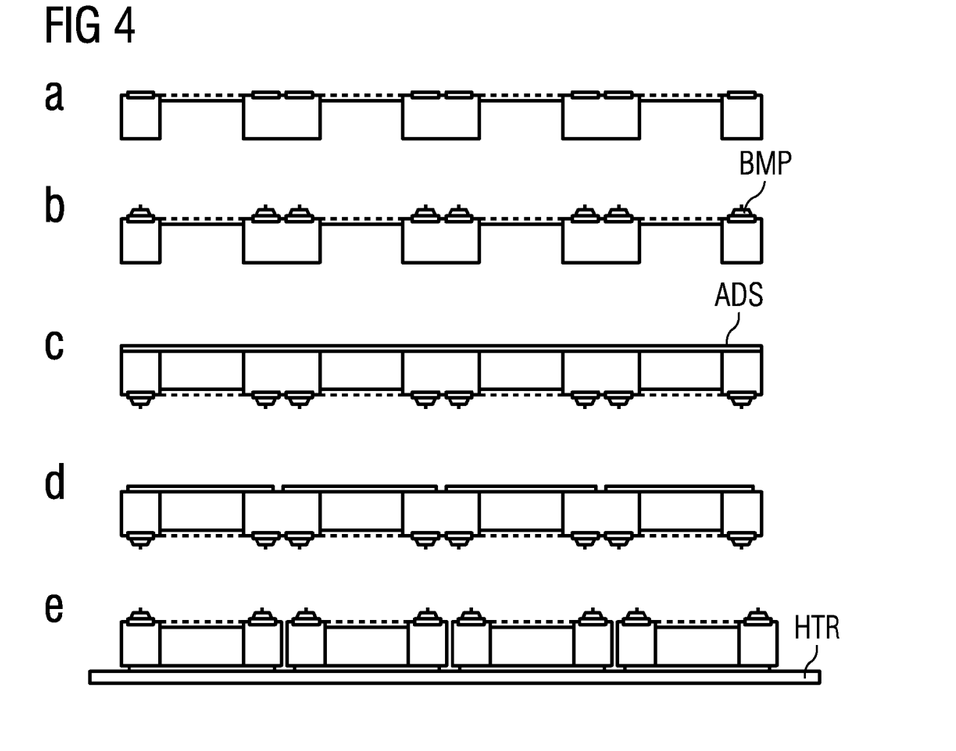
FIG. 4 shows various method stages in the production and singulation of MEMS microphone chips on the basis of schematic cross sections.

FIG. 4 shows various method stages of a production process known per se for MEMS microphone chips. Stage a) shows a silicon wafer in which a multiplicity of MEMS microphones are produced in parallel alongside one another. The individual microphone chips are still connected to one another via the wafer. Stage b) illustrates a method stage in which bumps for subsequent flip-chip mounting are applied to the electrical connection pads of the MEMS chip. These are preferably stud bumps, in particular composed of gold.

In method stage c), the back volume below the membrane is closed with a covering layer ADS, which is applied to the top side of the wafer over the whole area, for example. The covering layer ADS can be applied by lamination or adhesive bonding. It can consist of a plastic film. In method stage d), the covering layer ADS is separated along the separating lines between the individual microphone chips, for example by means of a laser ablation method.

In method stage e), the entire wafer is applied to an auxiliary carrier HTR by means of the covering layer ADS, for example with the aid of a readily releasable adhesive bond. The auxiliary carrier HTR serves for the retention of the individual microphone chips during and after separation, which can be effected for example by means of sawing along the separating lines between the microphone chips. Stage e) shows the singulated microphone chips, which are adhesively bonded on the auxiliary carrier HTR with the covering layer ADS.

Figure 5:
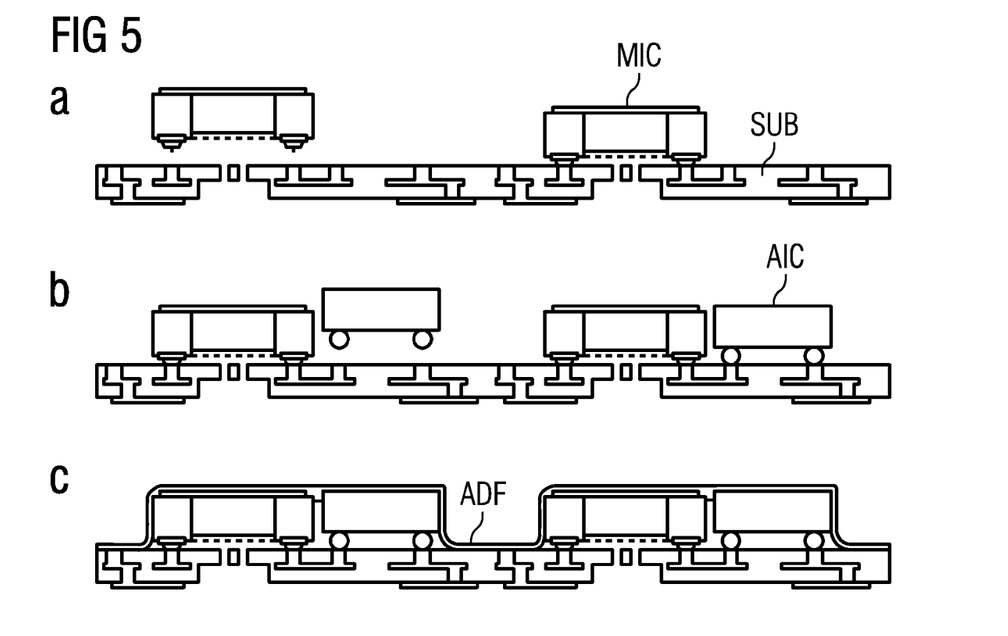
FIG. 5 shows various method stages in the mounting of microphone chips and IC components on a substrate on the basis of schematic cross sections.

FIG. 5 shows three method stages a) to c) during the production of a microphone chip and the mounting of the corresponding components on the substrate.

In stage a), the singulated microphone chips MIC are mounted with the aid of the stub bumps onto the corresponding contact areas on the top side of a ceramic multilayered substrate SUB in flip-chip design. The substrate SUB has a large area and affords space for a multiplicity of microphone chips MIC.

In method stage b), an IC component AIC is mounted alongside each microphone chip MIC, in particular likewise by means of flip-chip mounting using solder bumps.

Of course, it is also possible for firstly the IC component and then the microphone chip to be applied to the substrate.

In the next stage c), a covering film ADF is laminated over the microphone chips MIC and the IC components AIC such that it bears or rests flush on the top side of the chips, against the outer sides of the chips and on the surface of the substrate between the chips.

The metallization MET in the region of the sound entry opening SEO (see FIG. 3) can be produced in integrated fashion with the production of the substrate.

Figure 6:
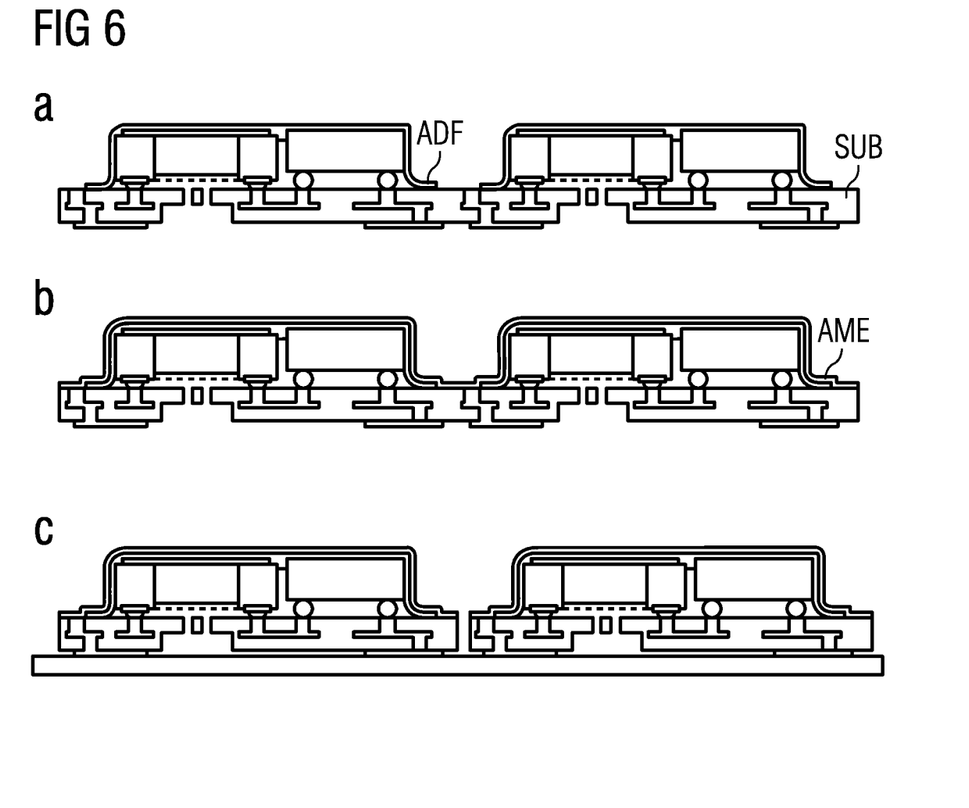
FIG. 6 shows various method stages in the covering and singulation of a microphone package on the basis of schematic cross sections.

FIG. 6 shows the further construction of the cover on the basis of three method steps a) to c) illustrated in schematic cross section. For this purpose, the covering film ADF is firstly removed from the surface of the substrate SUB in the region between the components assigned to an individual microphone package, for example by means of a laser ablation method. An external metallization AME is subsequently applied in step b). This can be effected in a multistage fashion, for example by a base metallization being applied by sputtering in a first step, which base metallization can subsequently be reinforced by plating with copper and nickel layers. The entire external metallization AME preferably has a thickness of approximately 50 µm or more. With this thickness, it is mechanically stable and the component thus coated or covered can be processed further by means of standard methods using vacuum pipettes and other pick-up means.

In method step c), the large-area substrate SUB with the microphone chips and IC components applied thereto for a multiplicity of microphone packages is adhesively bonded onto a sawing film by the underside of the substrate and subsequently cut by sawing from the top side, that is to say from the external metallization AME to the surface of the sawing film, and singulated in this way. The individual microphone packages can subsequently be taken from the sawing film.

Figure 9:
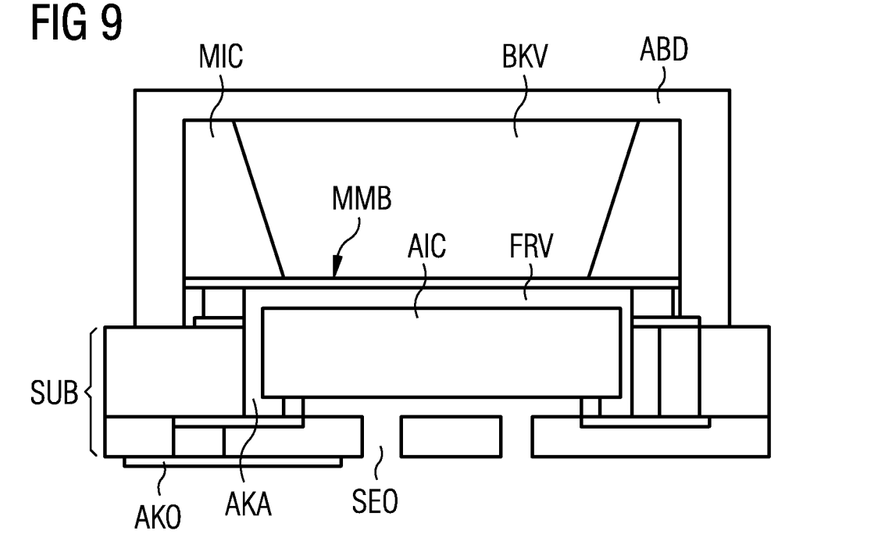
FIG. 9 shows a microphone package wherein IC component and microphone chip are arranged one above another.

FIG. 9 shows, in schematic cross section, a variant of a microphone package wherein the IC component AIC is arranged in a cutout of the substrate SUB below the microphone chip MIC. The depth of the cutout in the substrate can comprise one or a plurality of upper dielectric layers and has, in particular, a depth such that it can substantially or even completely accommodate the IC component. Thus, the microphone chip MIC can be bonded on the surface of the substrate outside the cutout without any problems. The sound entry opening SEO is in this case preferably arranged below the IC component AIC. However, it can also be embodied laterally as a perforation of the cover such that there is a connection to the front volume e.g. between membrane MMB and IC component AIC.

In contrast to the variants illustrated in FIGS. 1 and 3, here an acoustic channel arises which connects the sound entry openings SEO to the front volume FRV below the membrane in a non-rectilinear manner. This has the further advantage that the channel can be made correspondingly narrow with regard to the desired low-pass filter effect of the microphone package, such that the low-pass filter effect can be obtained exclusively or additionally by means of the acoustic channel. Since the required basic area for microphone chip and IC component is smaller in this arrangement than in the variant according to FIG. 3, overall the size of the microphone package can thus be minimized further. In addition, this variant has the advantage that for dirt particles and other contaminants, too, there is no straight path from the sound entry opening toward the membrane and contamination of, or damage to, the membrane can thus be avoided.

The invention is not restricted to the exemplary embodiments or even the figures. It lies within the scope of the invention to vary the acoustic channel and, consequently, the relative arrangement of microphone chip, acoustic channel and sound entry opening relative to one another and to bring about the acoustic properties and, in particular, the low-pass filter effect by means of a specific configuration of said acoustic channel. It also lies within the scope of the invention to combine different features from different embodiments with one another.

The microphone chip is not restricted either to silicon or to the capacitive principle. All other MEMS microphone chips which are produced according to micromechanical methods, or else electret microphones are possible. Microphone packages comprising more than one microphone or more than one IC component are also possible.

What is claimed is:

1. A microphone package, comprising
   a substrate;
   an MEMS microphone chip having a membrane, said microphone chip being mounted on top of the substrate;
   a cover, which is seated on top of the substrate and encloses the microphone chip between itself and the substrate;
   at least one sound entry opening through the substrate or the cover; and
   a front volume in front of the membrane, said front volume being connected to the sound entry opening via a channel,
   wherein the at least one sound entry opening, the channel and the front volume form a cavity system and have a geometry defined such that an air friction arises and the cavity system forms an acoustic low-pass filter having a −3 dB attenuation point below the natural resonances of the membrane and the package, and
   wherein the −3 db attenuation point of the acoustic low-pass filter is at a frequency of 75% or less of the natural resonance of the membrane.

2. The microphone package according to claim 1, wherein the at least one sound entry opening is between two and twenty sound entry openings, each of which is formed through the substrate and which together have a total cross-sectional area amounting to less than 50% of the membrane area.

3. The microphone package according to claim 1, wherein the natural resonances of membrane and package are attenuated by more than 30 dB.

4. The microphone package according to claim 1, wherein the diameter of the at least one sound entry opening is between 50 and 200 µm, or approximately 100 µm.

5. The microphone package according to claim 1, wherein the length of the sound entry opening is 50 to 500 µm, or approximately 150 µm.

6. The microphone package according to claim 1, wherein the aspect ratio of the sound entry opening is between 0.5 and 3.0.

7. The microphone package according to claim 1, wherein the at least one sound entry opening is at least four sound entry openings, each having a diameter of 90-110 µm and an aspect ratio of 1.3-1.7.

8. The microphone package according to claim 1,
   wherein the membrane of the MEMS microphone chip faces downward to the at least one sound entry opening,
   wherein the distance between the membrane of the MEMS microphone chip and the substrate is 5-100 µm, and
   wherein the cover includes a laminated covering film bearing against the MEMS microphone chip laterally and at the top thereof.

9. The microphone package according to claim 1, wherein the substrate is embodied in a multilayered fashion and includes at least two dielectric layers with integrated wiring and a material composed of HTCC, LTCC, or fiber-reinforced resin laminate.

10. The microphone package according to claim 9, wherein a metallization is applied on the substrate or between the dielectric layers, said metallization being exposed in the sound entry openings or being arranged near the sound openings on the underside of the substrate.

11. The microphone package according to claim 10, wherein the metallization is embodied on a downwardly facing area of the substrate or on a dielectric layer thereof as a planar metallization, wherein the at least one sound entry opening is formed within said planar metallization and perforates the latter.

12. The microphone package according to claim 11,
wherein the diameter of a first section of the at least one sound entry opening in a bottommost, dielectric layer of the multilayered substrate is greater than the diameter of the second section of the at least one sound entry opening in a topmost, dielectric layer,
wherein the at least one sound entry opening tapers from the first section toward the second section in a step and the section having the smaller diameter is arranged within the larger diameter,
wherein the metallization is arranged on the downwardly facing surface of the step.

13. The microphone package according to claim 1, wherein an IC component is additionally arranged between the cover and the substrate.

14. The microphone package according to claim 13, wherein the IC component and microphone chip are mounted alongside one another on the substrate using flip-chip technology and are covered with the same cover.

15. The microphone package according to claim 13, wherein the microphone chip and the IC component are fixed one above another.

16. The microphone package according to claim 15, wherein the IC component is arranged in a cutout of the substrate below the microphone chip.

17. A microphone package, comprising
a substrate;
an MEMS microphone chip having a membrane, said microphone chip being mounted on top of the substrate;
a cover, which is seated on top of the substrate and encloses the microphone chip between itself and the substrate;
at least one sound entry opening through the substrate or the cover; and
a front volume in front of the membrane, said front volume being connected to the sound entry opening via a channel,
wherein the at least one sound entry opening, the channel and the front volume form a cavity system and have a geometry defined such that an air friction arises and the cavity system forms an acoustic low-pass filter having a −3 dB attenuation point below the natural resonances of the membrane and the package, and
wherein the aspect ratio of the sound entry opening is between 0.5 and 3.0.

18. A microphone package, comprising
a substrate;
an MEMS microphone chip having a membrane, said microphone chip being mounted on top of the substrate;
a cover, which is seated on top of the substrate and encloses the microphone chip between itself and the substrate;
at least one sound entry opening through the substrate or the cover; and
a front volume in front of the membrane, said front volume being connected to the sound entry opening via a channel,
wherein the at least one sound entry opening, the channel and the front volume form a cavity system and have a geometry defined such that an air friction arises and the cavity system forms an acoustic low-pass filter having a −3 dB attenuation point below the natural resonances of the membrane and the package,
wherein the membrane of the MEMS microphone chip faces downward to the at least one sound entry opening,
wherein the distance between the membrane of the MEMS microphone chip and the substrate is 5-100 μm, and
wherein the cover includes a laminated covering film bearing against the MEMS microphone chip laterally and at the top thereof.

19. The microphone package according to claim 18, wherein the at least one sound entry opening is between two and twenty sound entry openings, each of which is formed through the substrate and which together have a total cross-sectional area amounting to less than 50% of the membrane area.

20. The microphone package according to claim 18, wherein the at least one sound entry opening is at least four sound entry openings, each having a diameter of 90-110 μm and an aspect ratio of 1.3-1.7.

* * * * *